(12) United States Patent
Kaneko

(10) Patent No.: US 6,507,746 B2
(45) Date of Patent: Jan. 14, 2003

(54) SUPERCONDUCTING WIRE AND METHOD OF MANUFACTURING THE SAME

(75) Inventor: Tetsuyuki Kaneko, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/788,492

(22) Filed: Feb. 21, 2001

(65) Prior Publication Data

US 2001/0021689 A1 Sep. 13, 2001

(30) Foreign Application Priority Data

Feb. 22, 2000 (JP) ........................................ 2000-044291

(51) Int. Cl.$^7$ .............................................. H01B 12/00
(52) U.S. Cl. ........................ 505/231; 505/236; 505/237; 428/699; 428/701; 428/930
(58) Field of Search ................................. 505/100, 230, 505/231, 236, 237, 238, 704, 813; 428/373, 375, 378, 379, 397, 699, 701, 702, 930

(56) References Cited

U.S. PATENT DOCUMENTS

| | | | | |
|---|---|---|---|---|
| 5,017,553 A | * | 5/1991 | Whitlow et al. | ............. 428/555 |
| 5,132,278 A | * | 7/1992 | Stevens et al. | ............. 428/614 |
| 5,192,739 A | * | 3/1993 | Lay | .......................... 156/89.17 |
| 5,330,966 A | * | 7/1994 | Hayashi et al. | ........ 204/192.24 |
| 5,384,307 A | * | 1/1995 | Lay | .......................... 174/125.1 |
| 5,625,332 A | * | 4/1997 | Kamo et al. | ............. 174/125.1 |
| 5,739,086 A | * | 4/1998 | Goyal et al. | ................. 117/101 |
| 5,801,124 A | * | 9/1998 | Gamble et al. | ............. 505/230 |
| 5,914,297 A | * | 6/1999 | Podtburg | .................... 428/615 |
| 5,929,000 A | * | 7/1999 | Hahakura et al. | ......... 174/125.1 |
| 5,999,833 A | * | 12/1999 | Funahashi et al. | .......... 428/702 |
| 6,028,036 A | * | 2/2000 | Tenbrink et al. | ......... 174/125.1 |
| 6,038,462 A | * | 3/2000 | Snitchler et al. | ......... 174/125.1 |
| 6,074,991 A | * | 6/2000 | Jenovelis et al. | ............. 29/599 |
| 6,240,620 B1 | * | 6/2001 | Kitaguchi et al. | ............. 29/599 |
| 6,265,354 B1 | * | 7/2001 | Wu | ............................. 505/430 |
| 6,271,473 B1 | * | 8/2001 | Tanaka et al. | ........... 174/125.1 |
| 6,311,385 B1 | * | 11/2001 | Ueyama et al. | ................ 29/599 |
| 6,349,226 B1 | * | 2/2002 | Yoshino et al. | .......... 174/125.1 |

FOREIGN PATENT DOCUMENTS

JP          4-43510          2/1992

OTHER PUBLICATIONS

L. Masur et al., "Long Length Manufacturing of BSCCO–2223 Wire for Motor and Cable Applications.", International Cryogenic Materials Conference, Montreal, Quebec, Canada, Jul. 12–16, 1999, American Superconductor Corporation, Westborough, MA 01581.

* cited by examiner

*Primary Examiner*—Tom Dunn
*Assistant Examiner*—Colleen P. Cooke
(74) *Attorney, Agent, or Firm*—Foley & Lardner

(57) ABSTRACT

The present invention provides an oxide superconducting wire including a component provided in the form of a tape and a metal tape. The component in the form of a tape has an oxide superconducting member and a metal coating member formed mainly of silver and coating a surface of the oxide superconducting member. The metal tape, bonded in a heat treatment (e.g., fusion- or diffusion-bonded) to a surface of the component in the form of a tape, does not contain any superconducting material and it is formed mainly of silver and it also contains at least one component other than silver.

7 Claims, 2 Drawing Sheets

SUPERCONDUCTING WIRE AND METHOD OF MANUFACTURING THE SAME

BACKGROUND OF THE INVENTION

1. Field of the Invention

The present invention relates to superconducting wire and methods of manufacturing the same.

2. Description of the Background Art

If a multifilament superconducting wire is formed of a superconducting material of copper oxide and metal coating the superconducting material, the wire is typically produced as follows: initially, powdery oxide is loaded into a pipe of metal such as silver to produce a monofilamentary wire. Then a plurality of such monofilamentary wires are bundled and thus inserted into another pipe of metal such as silver to obtain a multifilamentary structure serving as an original wire which is in turn for example drawn and rolled and thus formed in a tape and then heat treated to provide a superconducting wire.

While it is important that such a superconducting wire has a superconducting portion with properties, such as critical temperature and critical current, for practical use, it is also essential that the coating metal portion have properties, serving as follows:

(1) Coats an oxide superconducting material of ceramic to provide flexibility;

(2) Prevents the superconducting portion from providing performance impaired by an external factor (i.e., protects the superconducting portion against the external factor); and (3) Provides good electrical contact.

In recent years, of the above three objects, the second object has been +focused on and coating materials have thus been improved. There are two types of disturbance for oxide superconducting wire coated with metal. One is attributed to mechanical stress of tensility, bending and the like. The other is attributed to a pinhole in a wire surface, since the pinhole disadvantageously introduces a coolant into the superconducting wire and when it is heated the coolant vaporizes and expands and consequently destroys the superconducting portion.

The above two types of disturbance are limited basically by employing a metal coating portion in the form of a thick metal tube. While this can protect the superconducting portion, it also has a disadvantage; a superconductor is an oxide. As such, when it is heat treated, between the oxide and the external atmosphere a gas (oxygen in particular) is discharged and received inevitably. As such it is essential that the gas (oxygen in particular) be discharged and received smoothly (i.e., as naturally as possible) to obtain a highly pure superconducting phase. Thus, silver, having high oxygen permeability, is used as the coating member, although if the silver portion is thick its permeability would degrade.

Furthermore, if for a similar reason oxygen is not completely discharged from the wire the gas expands, resulting in the wire having a defect.

A thin tube can be used to provide a highly pure superconducting phase and prevent the wire from swelling, although it has a reduced level of strength and tends to result in more pinholes and other contrary phenomena.

A metal tube can also be increased in strength, as follows: rather than pure silver, silver with second and third metals added thereto is used as a starting material (a coating tube, referred to as an alloy tube) and it is heat treated and thus oxidized to disperse in the coating portion as an oxide to increase its strength. This silver coating tube with a second metal added thereto, however, is disadvantageous, as follows:

An oxide superconductor hardly reacts with silver and if it is in contact with silver it smoothly transitions to a superconducting phase targeted. The oxide superconductor, however, readily reacts with an element (or component) other than silver. As such, the powdery portion varies in composition and the superconducting phase targeted can thus not be highly pure. Thus, a wire using an alloy tube provides a level of critical current lower than that using a tube formed of pure silver. Furthermore, the variation in composition depends in magnitude on the concentration of the second element of the metal tube. As such, relatively low levels of concentration are often applied.

A superconducting wire in the form of a tape is provided with a second tape member stuck thereon to provide a wire significantly increased in strength, as disclosed in U.S. Pat. No. 5,801,124, Japanese Patent Laying-Open No. 4-43510, or L. Masur et al., "LONG LENGTH MANUFACTURING OF BSCCO-2223 WIRE FOR MOTOR AND CABLE APPLICATIONS", International Cryogenic Materials Conference Montreal, Quebec, Canada Jul. 12–16, 1999.

U.S. Pat. No. 5,801,124 discloses that a superconducting wire coated with silver that has undergone all heat treatments is provided with a tape member of stainless steel stuck thereon with an adhesive such as solder. Japanese Patent Laying-Open No. 4-43510 discloses a metal coated, oxide superconducting wire in the form of a tape having one side brought into contact with Ni, SUS or a similar metal in the form of a tape and thus heat treated to have a reinforcement member stuck on one side.

While the wires with a second tape member stuck thereon are advantageously increased in strength, there are still disadvantageous, as follows:

In U.S. Pat. No. 5,801,124, all heat treatments must be completed before the tape member is stuck. As such the number of process steps is increased and productivity thus drops. Furthermore, the step of sticking the second tape member can serve as disturbance to impair superconductivity. Furthermore, the adhesive used to stick the second tape member further increases the entire volume and the resultant wire cannot be compact.

In accordance with the method as disclosed in Japanese Patent Laying-Open No. 4-43510, a wire in the form of a tape has only one side with a metal tape stuck thereon. As such, all of such pinholes as aforementioned cannot be covered, although the method does not contemplate covering pinholes with a metal tape. Furthermore, the metal brought into contact does not contain silver as a main component and the composition thus tends to vary. Furthermore, Ni and SUS are oxidized at high temperature more readily than silver and they thus would alter.

SUMMARY OF THE INVENTION

The present invention contemplates a superconducting wire enhanced in superconductivity and mechanical strength, capable of preventing a coolant from entering thereinto and readily configured and prepared, and a method of preparing the same.

The present invention provides a superconducting wire including a component in the form of a tape and a metal tape. The component in the form of a tape has an oxide superconducting member and a metal coating member formed mainly of silver and coating a surface of the oxide superconducting member. The metal tape does not contain any superconducting material and it is formed mainly of silver and also contains at least one component other than silver, and it is bonded in a heat treatment to a surface of the component provided in the form of a tape.

In the superconducting wire of the present invention the metal tape mainly formed of silver can reduce variation of the oxide superconductor in composition to readily provide a highly pure superconducting phase and attain a high level of critical current. Furthermore the metal tape bonded in a heat treatment on a surface of the component provided in the form of a tape, can enhance mechanical strength.

Furthermore the metal tape bonded in a heat treatment on the surface of the component provided in the form of a tape can also cover a pinhole in the metal coating member. This can prevent a coolant from entering the superconducting wire in use and expanding the wire. Since the metal tape is bonded in a heat treatment, an adhesive or a bonding step is not required. As such, the superconducting wire can be compact and the process for preparing the same can also be simplified.

Furthermore the metal tape with a second component (a component other than silver) added thereto can readily enhance mechanical strength. Furthermore, the second component of the metal tape can be prevented from reacting with the superconducting portion, since the metal coating member is posed between the metal tape and the superconducting portion and the metal tape thus does not contact the superconducting portion directly.

It should be noted that in the present invention, the metal tape is formed of a material including silver with an oxide dispersed therein. Furthermore, in the present invention, "bonding in a heat treatment" conceptually includes fusion-bonding, diffusion-bonding and the like.

In the above superconducting wire preferably the component in the form of a tape has first and second main surfaces opposite to each other and the metal tape has a first portion bonded to the first main surface in a heat treatment and a second portion bonded to the second main surface in a heat treatment.

Thus the opposite surfaces can be covered with the metal tape and the metal coating member can thus have opposite surfaces with a pinhole covered with the metal tape. This can further prevent a coolant from entering and thus expanding the superconducting wire in use.

In the above superconducting wire preferably the metal tape has the first and second portions formed of different materials.

Using the metal tape sandwiching the component in the form of a tape that is formed of different materials, can provide a wire for a special application, such as requiring strength enhanced in one direction.

In the above superconducting wire preferably the metal tape is greater in mechanical strength than the component in the form of a tape.

Thus the metal tape can serve as a layer reinforcing the component in the form of a tape.

In the above superconducting wire preferably the metal tape is formed of silver with an oxide dispersed therein.

The metal tape with an oxide dispersed therein can enhance strength.

In the above superconducting wire preferably the oxide dispersed in the metal tape has a level of concentration in the metal tape higher than the concentration of an oxide in the metal coating member.

Thus the metal tape can have a level of strength higher than the metal coating member.

In the above superconducting wire preferably the oxide superconducting member is formed of a bismuth based superconductor.

For a superconducting wire as configured above a bismuth based superconductor is particularly suitable.

The present invention provides a method of manufacturing a superconducting wire, including the steps of: preparing a component in the form of a tape having a member at least with a superconducting phase, and a metal coating member formed mainly of silver and covering a surface of the member at least with a superconducting phase; and bring into contact with a surface of the component in the form of a tape a metal tape free of any superconducting material, formed of an alloy formed mainly of silver, and subjecting the component in the form of a tape and the metal tape to a heat treatment.

In the present method the component in the form of a tape and the metal tape are not fusion- or diffusion-bonded together until high temperature is attained in a heat treatment. As such, before they are fusion- or diffusion-bonded a pinhole in the metal coating member can introduce and discharge gas such as oxygen and in a heat treatment oxidization of a member containing a superconducting phase can be facilitated to obtain a highly pure superconducting phase. Furthermore, the pinhole allows gas such as oxygen to be discharged and thus output from the wire smoothly to prevent the gas from expanding the wire.

Furthermore, fusion- or diffusion-bonding the component in the form of a tape and the metal tape together in a heat treatment performed to provide a superconducting phase, can eliminate an extra step for bonding them together and thus enhance productivity. Furthermore, if sticking the metal tape onto the component in the form of a tape results in impaired superconductivity, a heat treatment that is subsequently performed can recover and enhance the impaired superconductivity.

Furthermore, fusion- or diffusion-bonding the metal tape can increase the final thickness of the portion coating the portion having a superconducting phase. As such the metal coating member itself is allowed to have a reduced thickness. As such, a pinhole is readily produced in the metal coating portion in the step of plastic forming or the step of heat treatment prior thereto. As such, if heat treatment is provided before the metal tape is stuck, a pinhole of the metal coating member allows gas such as oxygen to be smoothly introduced and discharged to readily achieve a highly pure superconducting phase and also facilitate discharging and externally outputting gas otherwise expanding the wire.

In the above method the heat treatment is performed with the component in the form of a tape having opposite, first and second main surfaces both in contact with the metal tape.

Thus the opposite surfaces can be covered with the metal tape and the metal coating member can thus have opposite surfaces with a pinhole covered with the metal tape. This can further prevent a coolant from entering and thus expanding the superconducting wire in use.

In the above method, the heat treatment performed with the component in the form of a tape having a surface in contact with the metal tape, corresponds to the final one of all heat treatments.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The present invention in one embodiment provides a superconducting wire provided as will be described hereinafter.

Figure 1:
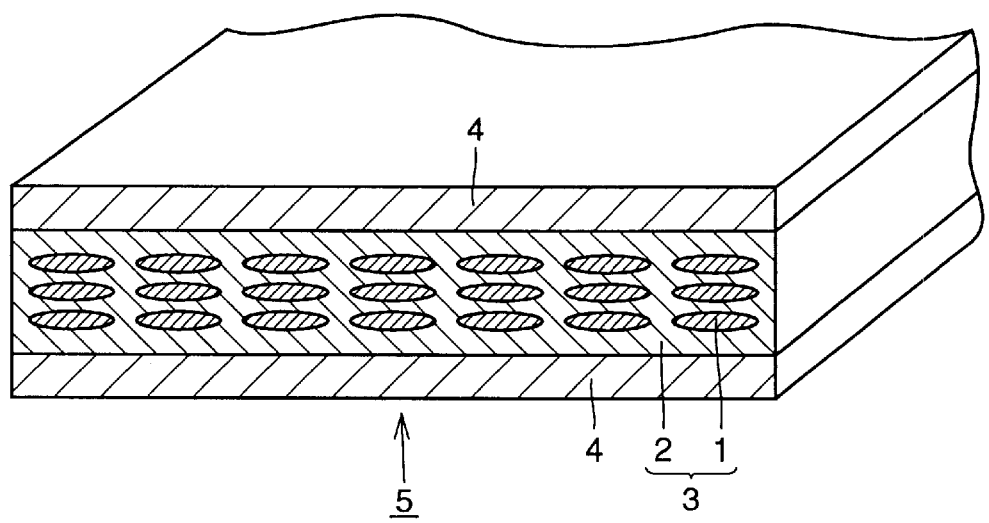
FIG. 1 is a perspective, partial cross section schematically showing a structure of an oxide superconducting wire in one embodiment of the present invention.

With reference to FIG. 1, the present invention provides a superconducting wire 5 having a component in the form of a tape 3 and a metal tape 4 bonded in a heat treatment (e.g., fusion- or diffusion-bonded) to a surface of the component in the form of a tape 3. The component in the form of a tape 3 includes a plurality of oxide superconducting members 1 and a metal coating member 2 formed mainly of silver and coating a surface of oxide superconducting member 1. Metal tape 4 does not contain any superconducting material and it contains silver as a main component and at least one component other than silver.

Metal tape 4 may be bonded in a heat treatment (e.g., fusion- or diffusion-bonded) to the component in the form of a tape 3 on either one of its front and rear surfaces, although preferably it is bonded in a heat treatment (e.g., fusion- or diffusion-bonded) to both of the surfaces. Furthermore, metal tape 4 bonded in a heat treatment (e.g., fusion- or diffusion-bonded) to the component 3 front surface may be different in material than that bonded in a heat treatment (e.g., fusion- or diffusion-bonded) to the component 3 rear surface. Preferably, metal tape 4 is formed of silver with an oxide dispersed therein and the oxide can be manganese oxide or the like. Preferably, metal tape 4 is greater in mechanical strength than component in the form of a tape 3. Preferably, the oxide dispersed in metal tape 4 has a level of concentration in metal tape 4 that is higher than the concentration of an oxide in metal coating member 2.

Furthermore, oxide superconducting member 1 is preferably formed of a bismuth based superconductor.

Furthermore, metal tape 4 and metal coating member 2 are preferably formed of different materials. Preferably, metal coating member 2 is formed of silver and metal tape 4 is formed of silver with an oxide dispersed therein.

An oxide superconducting wire is prepared as will now be described.

Figure 2:
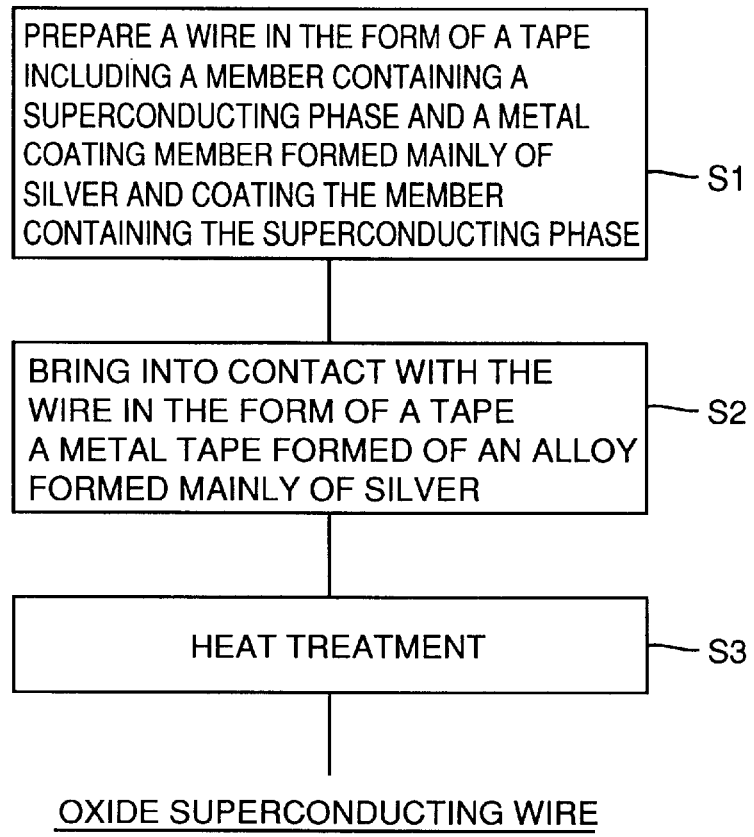
FIG. 2 represents a method of manufacturing an oxide superconducting wire in one embodiment of the present invention.

With reference to FIG. 2, a powdery source material of oxide or carbonate was mixed to provide a Bi:Pb:Sr:Ca:Cu ratio of 1.8:0.3:1.9:2.0:3.0. The mixture is heat treated more than once at approximately 700 to 860° C. to prepare powder to be loaded configured of a large amount of $(BiPb)_2Sr_2Ca_1Cu_2O_z$ (Bi-2212 phase), a small amount of $(BiPb)_2Sr_2Ca_2CU_{30}O_z$ (Bi-2223 phase) and a non-superconducting phase. The powder is loaded into a silver pipe and drawn and thus reduced in diameter. This wire is cut to provide 61 wires to be fit. The 61 wires are inserted into another silver pipe provided to receive such wires. Thus a multifilamentary structure with 61 filaments is provided. This multifilamentary, original wire is further drawn to be a double and it is then rolled to provide a wire in the form of a tape having an outer diameter of 4 mm in width and 0.25 mm in thickness and a length of approximately 1 km (step (S1)).

The wire in the form of the tape was heat treated in the atmosphere at 850° C. for 50 hours, without metal tape 4 stuck thereon. Then the wire in the form of the tape was again rolled.

Figure 3:
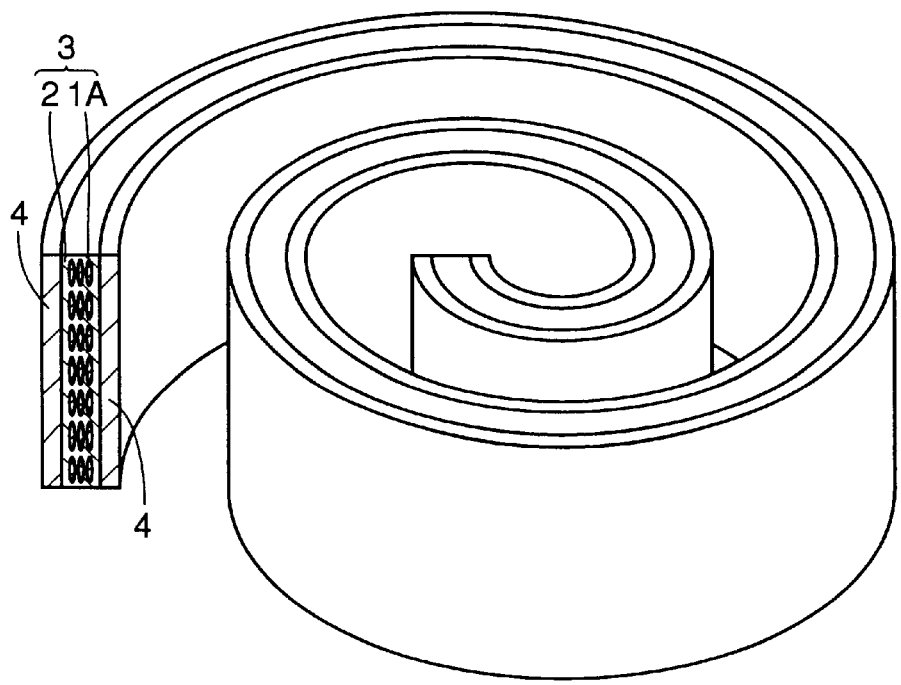
FIG. 3 is a schematic, perspective view showing a method of preparing an oxide superconducting wire in one embodiment of the present invention, in a condition for applying a final heat treatment.

Then, two metal tapes 4 formed of a silver-manganese alloy (concentration of manganese: 0.5% by mass) and having a thickness of 50 μm were used to sandwich the wire in the form of the tape at opposite sides (S2). Thus, as shown in FIG. 3, metal tape 4 was brought into contact with opposite surfaces of the component in the form of a tape 3 formed of a member 1A containing at least a superconducting phase and metal coating member 2 coating a surface of member 1A. The product is further heat treated in the atmosphere at 850° C. for 100 hours (S3) to provide oxide superconducting wire 5, as shown in FIG. 1.

Oxide superconducting wire 5 thus prepared had a value of critical current of 70 A at a temperature for liquid nitrogen and it did not have a defectively swollen portion over its entire length of 1 km that is attributed to a gas expanding in a heat treatment. The obtained wire also had a level in mechanical strength of 300 MPa when it is subjected to tensile strength at room temperature and thus estimated with a level of tensile stress having 90% of the value attained for an initial value of critical current (a condition without any force applied).

Figure 4:
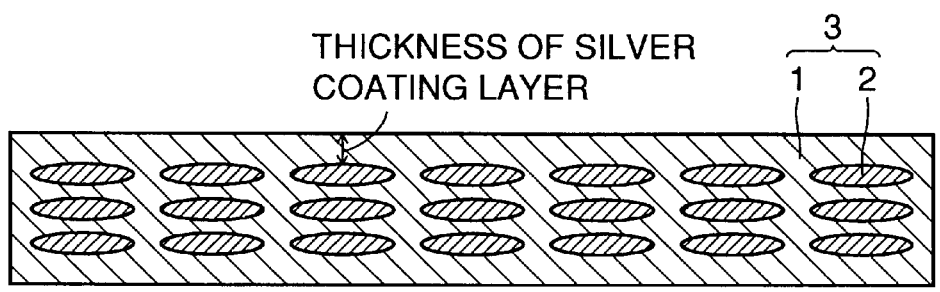
FIG. 4 is a cross section for illustrating a thickness of a silver coating layer.

Furthermore, in the above method, wire-receiving silver pipes different in thickness were used to prepare different types of components in tapes 3 having an outer diameter of 4 mm in width and 0.25 mm in thickness and having their respective silver coating layers different in thickness (FIG. 4). For comparison, they are heat treated, rolled and further heat treated without any metal tape 4 stuck thereon. Oxide wires thus obtained as comparative examples had their respective properties, provided as in Table 1.

TABLE 1

|  | Present Invention | Comparative Examples | | |
|---|---|---|---|---|
| Thickness of silver coating layer in FIG. 4 (μm) | 50 (With metal tape 4 of 50 μm stuck, for a total of 100 μm) | 30 | 100 | 200 |
| Value of critical current (A) | 70 | 100 | 50 | 40 |
| Mechanical strength (MPa) | 300 | 30 | 50 | 80 |
| Number of swollen points (number/km) after heat treatment | 0 | 0 | 20 | 100 |
| Number of swollen points (number/km) after immersion in liquid nitrogen | 0 | 50 | 20 | 0 |

It can be understood from Table 1 that as the silver coating layer is reduced in thickness the value of critical current increases, the number of swollen points after heat treatment decreases and mechanical strength also decreases. The number of swollen points after immersion in liquid nitrogen means the number of further increased swollen points as counted when the wire immersed in liquid nitrogen to have its critical current measured is removed from the nitrogen after the measurement and has attained room temperature. This is attributed to the fact that liquid nitrogen introduced during the measurement vaporizes and thus expands while temperature rises.

Thinner members tend to result in their respective wires having a surface with more pinholes. As such, liquid nitrogen readily enters the wires and thus expands them.

The present invention can achieve both of an advantage of a thick wire and that of a thin wire. For example, if a comparative example corresponding to a wire having a coating layer of 30 μm in thickness is accompanied with metal tape 4, as provided in the present invention, there can be provided a significantly strong wire having a level of critical current of 100 A.

Then wire-receiving silver pipes containing different concentrations of manganese were used to prepare different types of components in tapes 3, as comparative examples. Since they are comparative examples, they do not use metal tape 4 and they were used to provide oxide superconducting wire 5 in a method similar to that employed to provide the Table 1 comparative examples. They were compared with various examples of the present invention provided in a method similar to that in the example of the present invention as provided in Table 1, with a wire receiving silver pipe having a fixed manganese concentration and metal tape 4 corresponding to a silver tape having a varying manganese concentration. The examples of the present invention and the comparative examples had their respective properties, as provided in Table 2.

TABLE 2

| | Present Invention | | | | Comparative Example | | | |
|---|---|---|---|---|---|---|---|---|
| Concentration of manganese in silver pipe (% by mass) | 0.1 | 0.1 | 0.1 | 0.1 | 0.1 | 0.3 | 0.5 | 1 |
| Concentration of manganese in metal tape 4 (% by mass) | 0.3 | 0.5 | 0.7 | 1 | None | None | None | None |
| Value of critical current (A) | 72 | 70 | 71 | 70 | 70 | 65 | 40 | 20 |
| Mechanical strength (MPa) | 250 | 320 | 400 | 450 | 200 | 230 | 310 | 370 |

It can be seen from Table 2 that in the comparative examples, as the wire receiving silver pipe is increased in concentration of manganese, mechanical strength is enhanced and critical current decreases, whereas in the examples of the present invention, critical current does not depend on the concentration of manganese in metal tape 4 and only strength is enhanced. That is, the present invention can adjust only strength with metal tape 4 without changing the value of critical current.

Table 3 compares properties of a wire formed of the component in the form of a tape 3 and metal tape 4 stuck thereon from the first heat treatment onwards and those of a wire formed of component 3 and metal tape 4 stuck thereon from the second heat treatment onwards.

TABLE 3

| Metal tape 4 stuck at: | 1st heat treatment | 2nd heat treatment |
|---|---|---|
| Value of critical current (A) | 65 | 70 |
| Mechanical strength (MPa) | 300 | 300 |
| Number of small points for 1 km after heat treatment | 5 | 0 |
| Number of swollen points for 1 km after immersion in liquid nitrogen | 0 | 0 |

It can be understood from Table 3 that the wire with metal tape 4 applied from the first heat treatment onward provides a slightly lower value of critical current, since manganese as an element tends to diffuse into the powdery superconducting portion due to two heat treatments. The wire had a surface with a pinhole covered by metal tape 4 before the second heat treatment is performed, and the wire thus had a reduced number of gas discharging means and thus expanded.

The present invention can provide a superconducting wire with a metal tape formed mainly of silver to prevent an oxide superconductor from varying in composition. As such, a highly pure superconducting phase can be readily achieved and a high level of critical current can be obtained. Since the component in the form of a tape has a surface with the metal tape bonded thereto in a heat treatment, mechanical strength can be enhanced and a pinhole in a metal coating member can also be covered to prevent a coolant from entering the superconducting wire in use and thus expanding the wire. Since the metal tape is bonded in a heat treatment, an adhesive, a bonding step and the like can be dispensed with. As such, the resultant superconducting wire can be compact and the process for preparing the same can be simplified. Furthermore, adding a second component or the like to the metal tape can readily enhance mechanical strength. Furthermore, if the metal tape contains the second component, the metal tape does not contact the superconducting portion directly since the metal coating member is posed between the metal tape and the superconducting portion, and the second component can thus be prevented from reacting with the superconducting portion.

Furthermore, the present invention can provide a method of manufacturing a superconducting wire such that the component in the form of a tape and the metal tape are not bonded together in a heat treatment (e.g., fusion- or diffusion-bonded together) until high temperature is attained in a heat treatment. As such, before they are bonded together in a heat treatment (e.g., fusion- or diffusion-bonded together) a pinhole in the metal coating member can introduce and discharge gas and in a heat treatment oxidization of a member containing a superconducting phase can be facilitated to obtain a highly pure superconducting phase. Furthermore, the pinhole allows oxygen to be discharged and thus output from the wire smoothly to prevent oxygen from expanding the wire. Since the component in the form of a tape and the metal tape can be bonded together in a heat treatment (e.g., fusion- or diffusion-bonded together) performed to provide a superconducting phase, an extra step for bonding them together can be eliminated to enhance productivity. Furthermore, if sticking the metal tape onto the component in the form of a tape results in impaired superconductivity, a subsequent heat treatment can recover and enhance the impaired superconductivity.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A superconducting wire comprising:

a component provided in a form of a tape, said component having a longitudinal dimension and including a plurality of oxide superconducting members which make a multifilamentary structure and a metal coating member formed mainly of silver and coating said plurality of oxide superconducting members;

a first metal tape free of any superconducting material, formed mainly of silver and containing at least one material other than silver, and bonded to a first surface of said component in said longitudinal dimension; and wherein a thickness direction of said component is not covered by said first metal tape.

2. The superconducting wire according to claim 1, wherein:

said component has a second surface which extends in the longitudinal dimension and which is opposite to said first surface extending in the longitudinal dimension; and a second metal tape is bonded to said second surface.

3. The superconducting wire according to claim 2, wherein said first and second metal tapes are formed of different materials.

4. The superconducting wire according to claim 1, wherein said first metal tape is greater in mechanical strength than said component.

5. The superconducting wire according to claim 4, wherein said first metal tape is formed of silver with an oxide dispersed therein.

6. The superconducting wire according to claim 5, wherein a concentration of said oxide in said first metal tape is higher than a concentration of an oxide in said metal coating member.

7. The superconducting wire according to claim 1, wherein said oxide superconducting member is formed of a bismuth based superconductor.

* * * * *